(12) United States Patent
Lee

(10) Patent No.: US 7,345,703 B2
(45) Date of Patent: Mar. 18, 2008

(54) CMOS IMAGE SENSOR INCLUDING PHOTODIODES HAVING DIFFERENT DEPTH ACCORDING TO WAVELENGTH OF LIGHT

(75) Inventor: Won-Ho Lee, Ichon-shi (KR)

(73) Assignee: Magnachip Semiconductor, Ltd., Cheongju, Chung Cheong Bok-Do (KR)

( * ) Notice: Subject to any disclaimer, the term of this patent is extended or adjusted under 35 U.S.C. 154(b) by 616 days.

(21) Appl. No.: 10/330,138

(22) Filed: Dec. 30, 2002

(65) Prior Publication Data
US 2004/0080638 A1 Apr. 29, 2004

(30) Foreign Application Priority Data
Oct. 23, 2002 (KR) ............. 10-2002-0064890

(51) Int. Cl.
| | |
|---|---|
| H04N 3/14 | (2006.01) |
| H04N 5/335 | (2006.01) |
| H04N 9/04 | (2006.01) |
| H04N 9/083 | (2006.01) |
| H01L 31/06 | (2006.01) |
| H01L 21/00 | (2006.01) |

(52) U.S. Cl. .................. 348/272; 257/440; 438/48
(58) Field of Classification Search ............. 257/294, 257/440, 435, 291, 292, 290; 348/272; 438/66, 438/69–71, 57, 199, 73, 48
See application file for complete search history.

(56) References Cited

U.S. PATENT DOCUMENTS 4,242,694 A * 12/1980 Koike et al. .............. 257/294
6,221,686 B1 * 4/2001 Drowley et al. ............. 438/57
6,518,115 B2 * 2/2003 Lee et al. ................. 438/231
6,548,833 B1 * 4/2003 Lin et al. .................. 257/89
6,756,616 B2 * 6/2004 Rhodes ..................... 257/291
6,830,951 B2 * 12/2004 Laurin et al. .............. 438/69
6,934,050 B2 * 8/2005 Merrill et al. ............ 358/1.16

FOREIGN PATENT DOCUMENTS

| JP | 61-183958 A | 8/1986 |
|---|---|---|
| JP | 5-267638 A | 10/1993 |
| JP | 2000-228513 A | 8/2000 |
| JP | 2001-15727 A | 1/2001 |
| KR | 1020020058459 A | 7/2002 |
| KR | 1020020058919 A | 7/2002 |

OTHER PUBLICATIONS

Funsten, IEEE Transactions on Nuclear Science, vol. 48, No. 6, pp. 1785-1789 (2001).
Oh, IEEE, pp. 75-78 (1999).

* cited by examiner

Primary Examiner—Tuan Ho
Assistant Examiner—Gregory V Madden
(74) Attorney, Agent, or Firm—Birch, Stewart, Kolasch & Birch, LLP

(57) ABSTRACT

An image sensor capable of preventing the cross-talk phenomenon due to a deep penetration depth and a low absorption coefficient of red light in a photodiode region and a method for fabricating the same, wherein the photodiode for collecting incident light has different depths in accordance with the wavelength of the incident light. The photodiode for receiving red light, which has the longest wavelength, has the deepest depth, the photodiode for receiving blue light has the least depth, and the photodiode for receiving green light, which has a wavelength between the red light and the blue light has an intermediate depth.

14 Claims, 10 Drawing Sheets

CMOS IMAGE SENSOR INCLUDING PHOTODIODES HAVING DIFFERENT DEPTH ACCORDING TO WAVELENGTH OF LIGHT

FIELD OF THE INVENTION

The present invention relates to an image sensor; and, more particularly to an image sensor capable of preventing the cross-talk phenomenon due to a deep penetration depth and low absorption coefficient of red light in a photodiode region and a method for fabricating the same.

DESCRIPTION OF RELATED ARTS

Generally, a charge couple device (CCD) or a photodiode (PD) in a complementary metal-oxide semiconductor (CMOS) image sensor is an induction component for converting incident light having different wavelengths into an electric signal. Ideally, quantum efficiency is 1 in all wavelength bands, meaning that all incident lights are collected. It has been currently attempted to achieve this condition.

FIG. 1A is a cross-sectional view showing a unit pixel of a CMOS-image sensor in accordance with a prior art.

Referring to FIG. 1A, a p-type epi-layer 12 is grown on a p-type substrate 11. A field oxide layer 13 for dividing incident regions of green, red and blue light is formed on the p-type epi layer 12. Each photodiode for each color PD_G, PD_R and PD_B is formed within the p-type epi layer 12 of each color incident region. Each photodiode PD_G, PD_R and PD_B includes a shallow $P^0$ region and a deep $n^-$ region.

Gate electrodes 14, 15 and 16 of a transfer transistor being aligned in one side of each photodiode PD_G, PD_R and PD_B are formed on the p-type epi layer 12. Then, a number of spacers 14A, 15A and 16A are formed at each corresponding lateral sides of the gate electrode 14, 15 and 16.

Afterwards, an inter-layer insulating layer 17 is formed on top of each gate electrode 14, 15 and 16 and the p-type epi layer 12. Herein, the inter-layer insulating layer 17 is planarized. A color filter array (CFA) constructed on the inter-layer insulating layer 17 includes a green filter, a red filter and a blue filter, each corresponding to each photodiode region PD_G, PD_R and PD_B.

The photodiodes of a typical image sensor as illustrated in FIG. 1A is formed to have the same range of projection (RP) with regardless of red, green and blue.

FIG. 1B is a diagram showing a penetration depth and an absorption coefficient in accordance with a wavelength of light.

With reference to FIG. 1B, as the wavelength (λ) of light increases, the penetration depth×proportionally increases but the absorption coefficient within the silicon layer decreases.

Therefore, even in case that the identical light, particularly, visible rays are inputted, red light having a long wavelength has a decreased absorption coefficient. This decreased absorption coefficient results in decreased red signals and imbalance in color ratio.

Referring to FIG. 1A based on FIG. 1B, in case of green light $L_G$ and blue light $L_B$, each penetration depth is limited to be mostly within a boundary of each photodiode region PD_G and PD_B. Hence, it is possible to output a stable image signal.

However, red light LR has a long wavelength and a deep penetration depth, and thus, it is highly probable to be out of the boundary of the photodiode region PD_R. As a result, there is a problem of the cross-talk phenomenon occurring when charges are unable to be within the photodiode region PD_R and move to neighboring photodiode regions. Because of this cross-talk phenomenon, outputs of the red signal are decreased substantially and a color ratio becomes imbalanced.

SUMMARY OF THE INVENTION

It is, therefore, an object of the present invention to provide an image sensor capable of preventing the cross-talk phenomenon due to a deep penetration depth and a low absorption coefficient of red light in a photodiode region and a method for fabricating the same.

In accordance with an aspect of the present invention, there is provided an image sensor for imaging from at least two wavelengths of light, the image sensor comprising: a plurality of unit pixels, wherein the unit pixels are classified with at least two groups according to the wavelength light; a photodiode formed in each unit pixel for receiving light, wherein depth of photodiode in unit each pixel is different according to the wavelength light.

In accordance with another aspect of the present invention, there is also provided a method for fabricating an image sensor, comprising the steps of: forming a gate electrode on each color region of an epi layer defining a red color region, a green color region and a blue color region; forming a number of photodiodes, each having different depths for each color region by applying an ion implantation process to the epi layer; forming an insulating layer on the epi layer including the number of the photodiodes; and forming color filters corresponding to each color region on the insulating layer.

In accordance with still another aspect of the present invention, there is also provided a method for forming a photodiode of an image sensor, comprising the steps of: forming a field oxide layer in a substrate to define each color region; forming an n-type ion implantation region in the substrate of each color region through an ion implantation, wherein the n-type ion implantation region in each color region has different depth according to wavelength of light corresponding to each color region; and forming a p-type ion implantation layer on the n-type ion implantation region.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

Figure 1A:
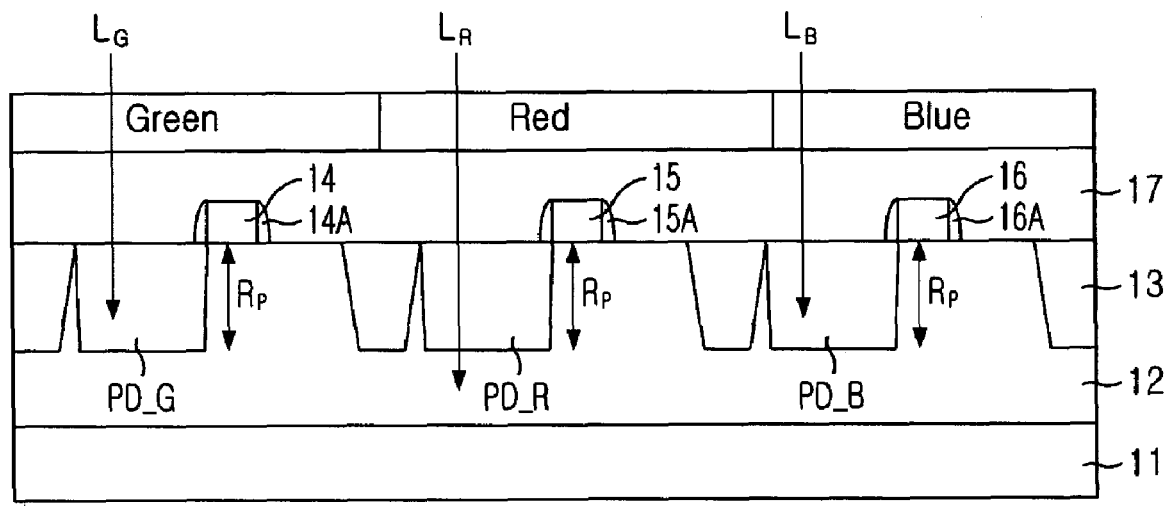
FIG. 1A is a cross-sectional view showing a unit pixel of a complementary metal-oxide semiconductor (CMOS) image sensor in accordance with a prior art.
Figure 1B:
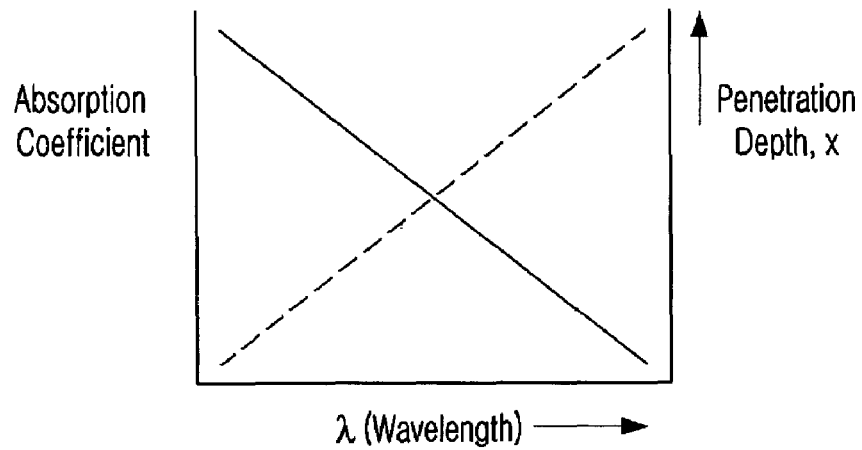
FIG. 1B is a diagram showing a penetration depth and an absorption coefficient in accordance with a wavelength of light.
Figure 2:
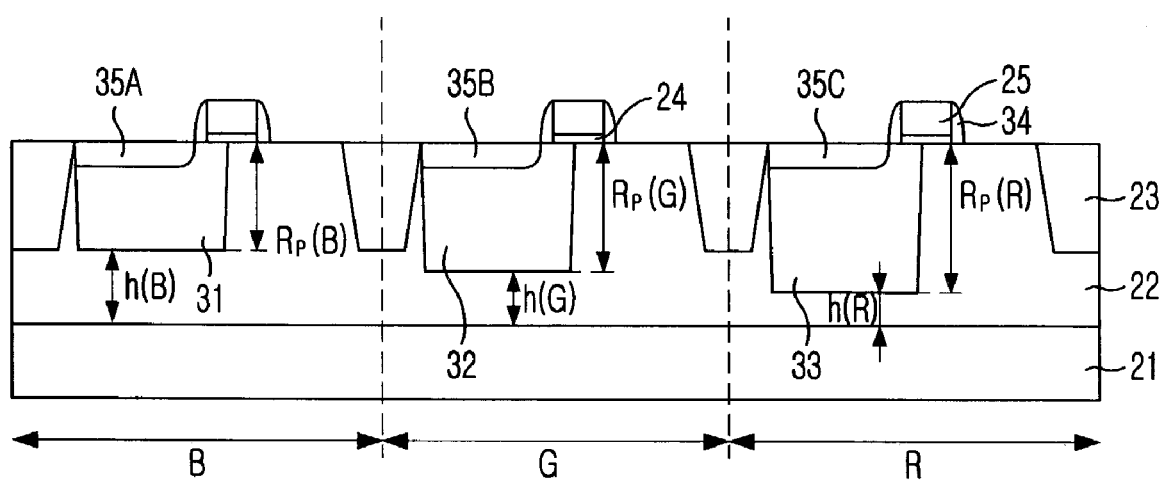
FIG. 2 is a cross-sectional view showing a unit pixel of a CMOS image sensor in accordance with a preferred embodiment of the present invention.

FIG. 2 is a cross-sectional view showing a unit pixel of a CMOS image sensor in accordance with a preferred embodiment of the present invention.

Referring to FIG. 2, a low concentration of a p-type epi layer 22 is grown on a p-type substrate 21 doped with a high concentration-of a p-type dopant. A field oxide layer 23 is formed on a predetermined portion of the p-type epi layer 22. The field oxide layer 23 defines a blue color region B, a green color region G and a red color region R.

A photodiode receiving blue light and having a range of projection (Rp) that is blue (Rp(B)) is formed within the blue color region B of the p-type epi layer 22. Similarly, a photodiode receiving green light and having an Rp that is green (Rp(G)) is formed within the green color region of the p-type epi layer 22. A photodiode receiving red light and having an Rp that is red (Rp(R)) is also formed within the red color region of the p-type epi layer 22.

With respect to the photodiode of each color region, the photodiode of the green color region includes a shallow $p^0$ region 35A and a first deep $n^-$ region 31. Also, the photodiode of the blue color region includes a shallow $p^0$ region 35B and a second deep $n^-$ region 32. The photodiode of the red color region includes a shallow $p^0$ region 35C and a third deep $n^-$ region 33.

Herein, each of the p regions 35A, 35B and 35C has the identical depth. The third deep $n^-$ region 33 receiving red light, which has the longest wavelength among incident lights, has the deepest depth. The second deep $n^-$ region 32 receiving green light, which has a wavelength shorter than the red light, is deeper than the first deep $n^-$ region 31 receiving blue light, which has the shortest wavelength. That is, the Rp(R) is deeper than the Rp(G) and the Rp(B), and the Rp(G) is deeper than the Rp(B).

This different Rp means that the Rp is deeper as the wavelength of the incident light is longer.

Subsequent to the formation of the photodiode, a gate electrode 25 including a spacer 34 is formed on the p-type epi layer 22 excluding the photodiode region. Herein, the gate electrode is a gate electrode of the transfer transistor $T_x$. Therefore, the photodiode for each color forms a pn junction by including the $p^0$ region and the $n^-$ region, each being a p-type ion implantation region and an n-type ion implantation region, respectively. The $p^0$ region included in each photodiode is aligned in an edge of the spacer 34, and one side of the $n^-$ region included in each photodiode is expanded to a bottom of the gate electrode 25.

Referring to FIG. 2, a distance h(R) between the third $n^-$ region 33 and the p-type substrate 21 is the shortest, and a distance h(B) between the first $n^-$ region 31 and the p-type substrate 21 is the longest. A distance h(G) between the second $n^-$ region 32 and the p-type substrate 21 is longer than the h(R) but shorter than the h(B).

Eventually, as the distance between the p-type substrate 21 and the n-type region, particularly, the h(R) decreases, it is possible to prevent the cross-talk phenomenon between neighboring pixels due to red light.

FIGS. 3A to 3G are cross-sectional views illustrating a first method for fabricating the unit pixel of the CMOS image sensor.

Figure 3A:
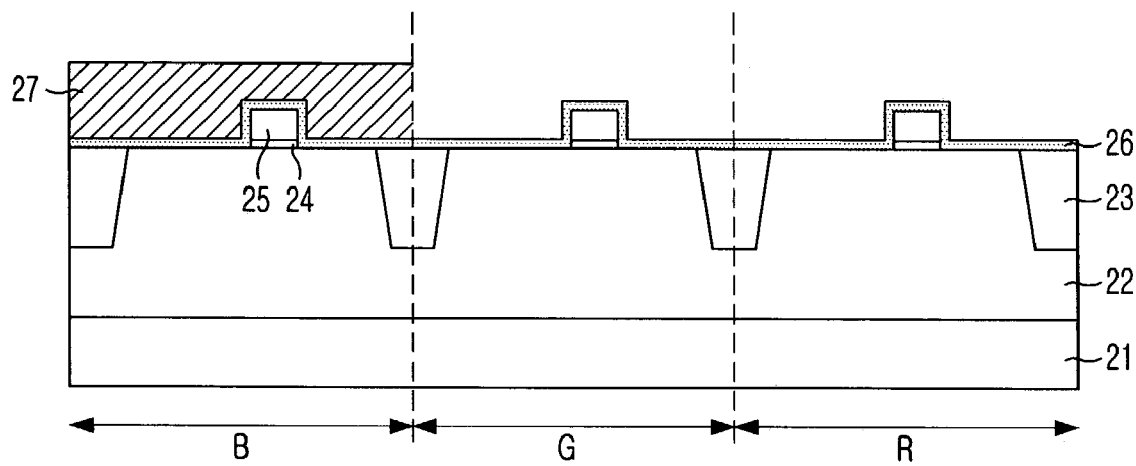
FIGS. 3A to 3G are cross-sectional views illustrating a first method for fabricating the unit pixel of the CMOS image sensor shown in FIG. 2.

With reference to FIG. 3A, a p-type epi layer 22 is grown on a p-type substrate 21 doped with a high concentration of p-type impurities. The p-type epi layer 22 existing beneath the photodiode causes the photodiode to have an increased depletion depth. As a result, it is possible to obtain excellent photosensitizing characteristics.

Next, a field oxide layer 23 is formed on the p-type epi layer 22 so to define a green color region G_region, a red color region R_region and a blue color region B_region.

At this time, the field oxide layer 23 is formed through a shallow trench isolation (STI) technique or a local oxidation of silicon (LOCOS) process.

After forming the field oxide layer 23, a gate oxide layer 24 and a gate electrode 25 are stacked on the p-type epi layer 22. At this time, the gate electrode 25 uses a polysilicon layer or a stacked layer of a polysilicon layer and a tungsten silicide layer. A thickness of the gate electrode 25 ranges from about 2500 Å to about 3500 Å since an ion implantation for forming the deep $n^-$ region of the photodiode is proceeded with high energy.

Herein, the gate electrode 25 is a gate electrode of a transfer transistor, and other gate electrodes of other types of transistors constituting the unit pixel are also formed simultaneously.

Afterwards, a first oxide layer 26 is formed on the p-type epi layer 22 including the gate electrode 25, and a first mask 27 covering the blue color region is formed thereon.

At this time, a reticle of the first mask 27 is identical to that of a blue filter mask for forming a blue filter during a color filer array (CFA) formation. This reticle is a photosensitive pattern attained through which a photosensitive film is coated and patterned by using a photo-exposure process and a developing process. Also, a positive photoresist is used to form the photosensitive pattern.

Figure 3B:
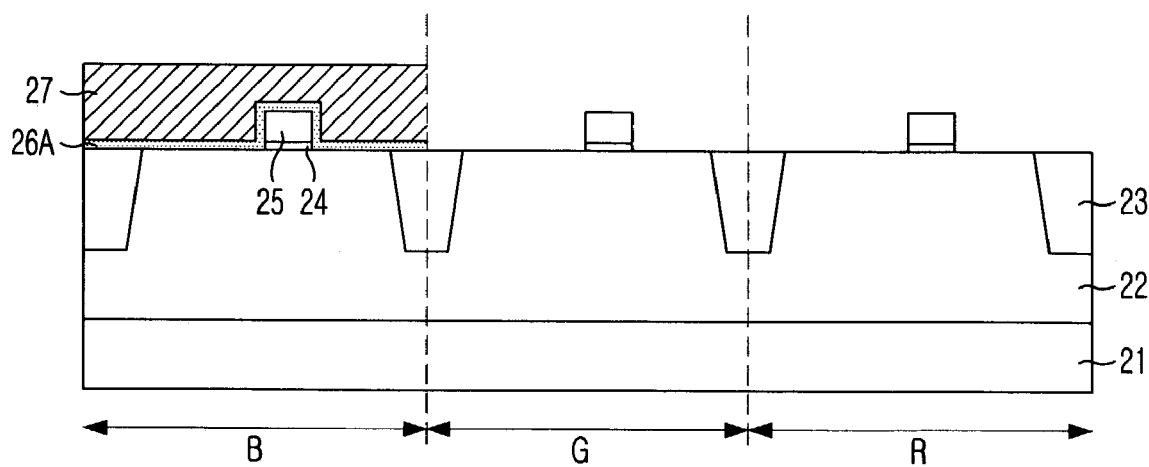

With reference to FIG. 3B, the first oxide layer 26 is proceeded with a wet etching by using the first mask 27 as an etch mask so to form a first blocking layer 26A. At this time, the first blocking layer 26A covers the blue color region but is not formed in the green and red color regions.

Figure 3C:
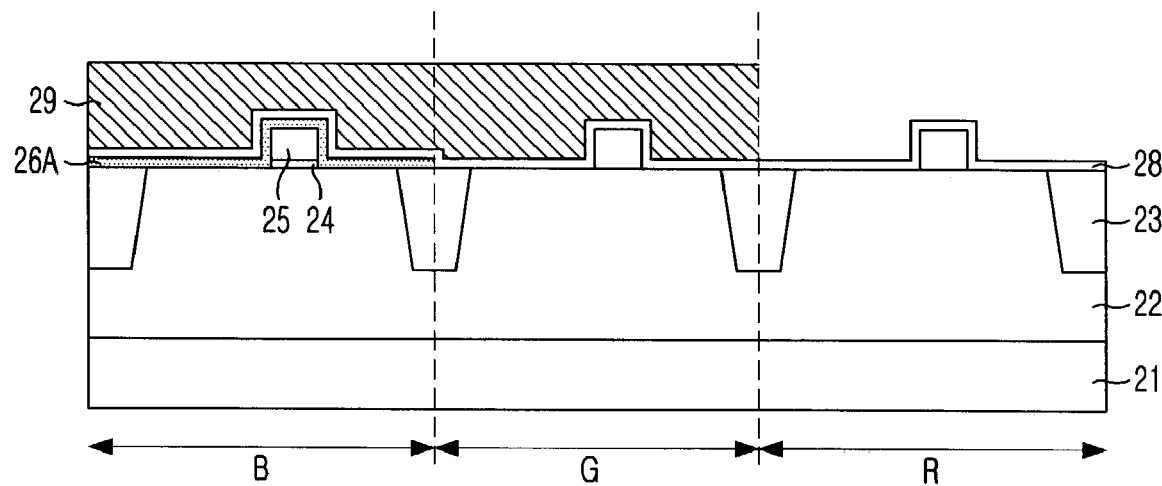

With reference to FIG. 3C, after removing the first mask 27, a second oxide layer 28 is formed on the p-type epi layer 22 including the first blocking layer 26A. A second mask 29 covering the green color region and the blue color region is formed on the second oxide layer 28.

At this time, a reticle of the second mask 28 is identical to that of a green filter mask for forming a green filter during the CFA formation, and is a photosensitive pattern attained through which a photosensitive film is coated and patterned by using a photo-exposure process and a developing process.

Figure 3D:
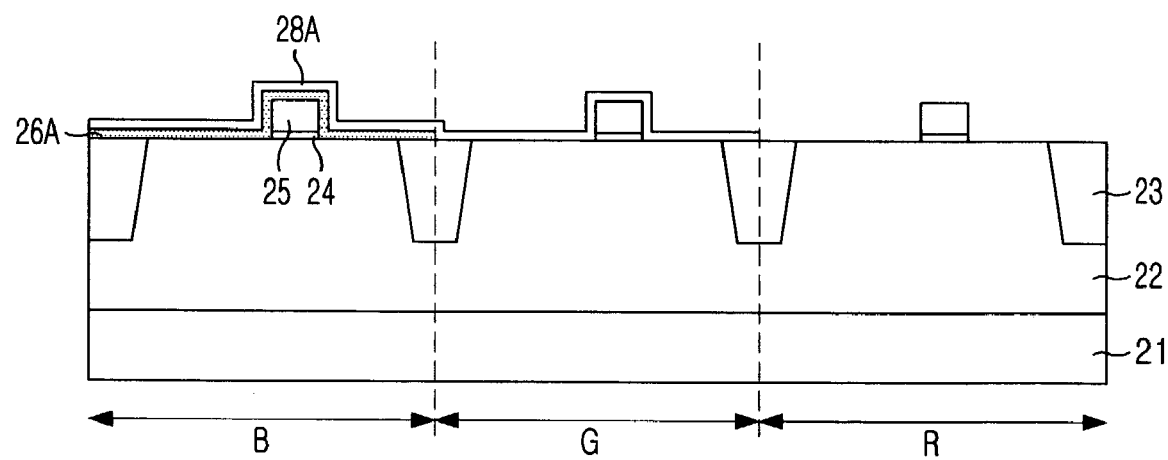

With reference to FIG. 3D, the second oxide layer 28 is proceeded with a wet etching by using the second mask 29 as an etch mask so to form a second blocking layer 28A. At this time, the second blocking layer 28A covers the blue color region and the green color region but is not formed in the red color region.

Next, the second mask 29 is removed.

A double layer of the first blocking layer 26A and the second blocking layer 28A is remained in the blue color region through the above-described processes. In the green color region, a single layer of the second blocking layer 28A is remained. However, there is no blocking layer in the red color region.

In other words, the blue color region for receiving blue light has the thickest blocking layer, and the green color region for receiving green light has an intermediately thick blocking layer. The red color region for receiving red light does not have the blocking layer. Eventually, as the wavelength is longer, the thickness of the blocking layer is thinner.

Figure 3E:
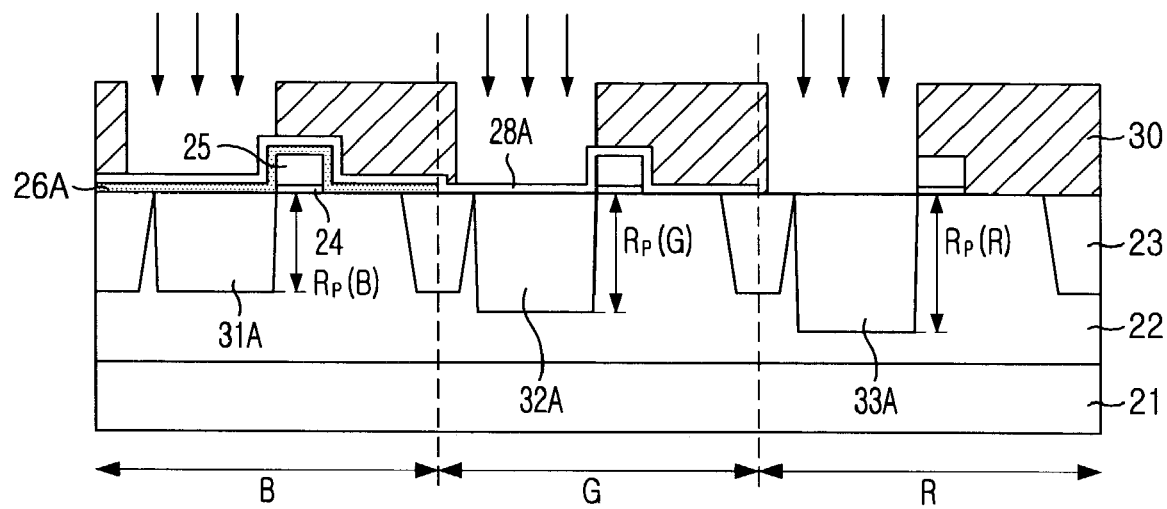

Referring to FIG. 3E, a photosensitive film is coated on the entire structure including the second blocking layer 28A and patterned through a photo-exposure process and a developing process so as to form a third mask 30 defining the deep n⁻ region of the photodiode.

At this time, the third mask 30 is aligned in one edge of the gate electrode 25 and one edge of the field oxide layer 23. Also, the third mask 30 covers the other side of the gate electrode 25, e.g., a portion for forming a floating diffusion region.

Next, an ion implantation of an n-type dopant is carried out with high energy but without any tilted incident angle and rotation. Herein, the third mask 30 is used as an ion implantation mask.

At this time, after the ion implantation, a first n-type region 31A having the most shallow Rp is formed within the p-type epi layer 22 of the blue color region. In the red color region, a third n-type region 33A having the deepest Rp is formed, while a second n-type region 32A having an intermediate depth of the Rp is formed in the green color region.

Even if the ion implantation is carried out under the same ion implantation recipe, the Rp for each color region are different from each other due to a different thickness of the blocking layer formed in each color region. That is, the blocking layer acts as a mask when ion implanting, resulting in a different Rp for each color region.

Through the above ion implantation, the first, the second and the third n⁻type regions 31A, 32A and 33A have the RP of Rp(B), Rp(G) and Rp(R), respectively. Also, a degree of the depth of the first, the second and the third n-type regions 31A, 32A and 33A is in an order of Rp(R)>Rp(G)>Rp(B).

Figure 3F:
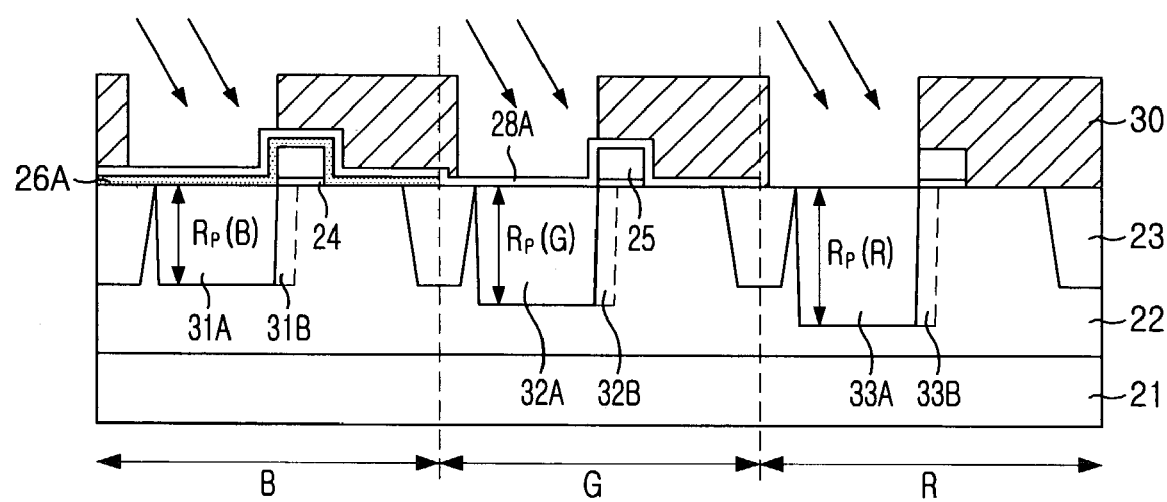

Referring to FIG. 3F, another ion implantation is proceeded with a medium energy with a tilted incident angle and rotation. At this time, the third mask 30 is still remained.

Since the ion implantation is proceeded with the tilted incident angle, each of the first, the second and the third n-type regions 31A, 32A and 33A has a doping profile expanded downwardly from the gate electrode 25. In other words, a first n-type expansion region 31B, a second n-type expansion region 32B and a third n-type expansion region 33B are formed.

Figure 3G:
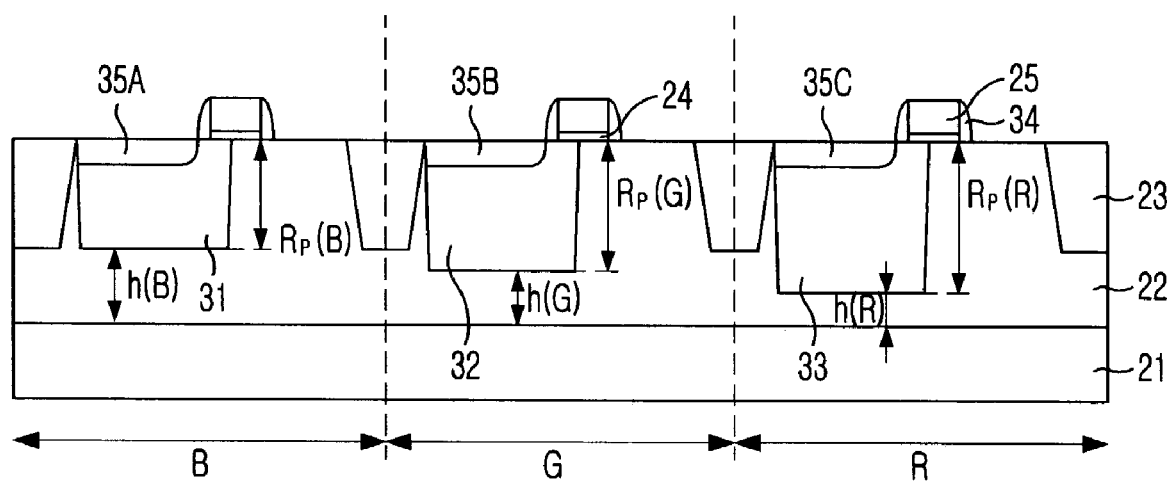

Referring to FIG. 3G, the third mask 30 is removed thereafter.

A first n⁻ region, a second n⁻ region and a third n⁻ region 31, 32 and 33 constructing the n⁻ region of the photodiode through two applications of the ion implantation. That is, the first n⁻ region 31 having Rp(B) is formed in the blue color region, the second n⁻ region 32 having Rp(G) in the green color region and the third n⁻ region 33 having Rp(R) in the red color region. In addition, the Rp(R) of the third n⁻ region 33 is deeper than the Rp(B) of the first n⁻ region 31 and the Rp(G) of the second n⁻ region 32, meaning that the Rp is deeper as the wavelength of light incident to the photodiode is longer.

An insulating layer is deposited on an entire surface exposed after removing the third mask 30, and an etch-back process is applied thereto so as to form a spacer 34 contacting to both lateral sides of the gate electrode 25. At this time, the insulating layer for forming the spacer 34 uses a nitride layer or an oxide layer. Since the first and the second blocking layer 26A and 28A are oxide layers, they are removed during the etch-back process for forming the spacer 34.

Next, a p-type dopant is ion implanted by using the gate electrode 25 and the spacer 34 as an ion implantation mask so to form shallow p⁰ regions 35A, 35B and 35C, each being formed in each color region. At this time, the p⁰ regions 35A, 35B and 35C are formed through the ion implantation along with a state that the first and the second blocking layers 26A and 28A are removed. Hence, each p⁰ region in each color region has the identical depth.

In other words, the photodiode including the first n⁻ region 31 and the p⁰ region 35A is formed in the blue color region, the photodiode including the second n⁻ region 32 and the p⁰ region 35B in the green color region, and the photodiode including the third n⁻ region 33 and the p⁰ region 35C in the red color region.

Herein, a distance h(R) between the third n⁻ region 33 and the p-type substrate 21 is the shortest while a distance h(B) between the first n⁻ region 31 and the p-type substrate 21 is the longest. Also, a distance h(G) between the second n⁻ region 32 and the p-type substrate 21 is an intermediate distance.

Meanwhile, as the distance h between the p-type substrate 21 and the n type region, particularly, the h(R) decreases, it is possible to prevent the cross-talk phenomenon occurring between neighboring pixels due to red light. The reason for this result is because a concentration of drift electrons is decreased due to active recombination of an electron hole pair (EHP) during inputs of optical charges owing a fact that the distance from the p-type substrate 21 decreases.

FIGS. 4A to 4H are cross-sectional views illustrating a second method for fabricating the unit pixel of the CMOS image sensor.

Figure 4A:
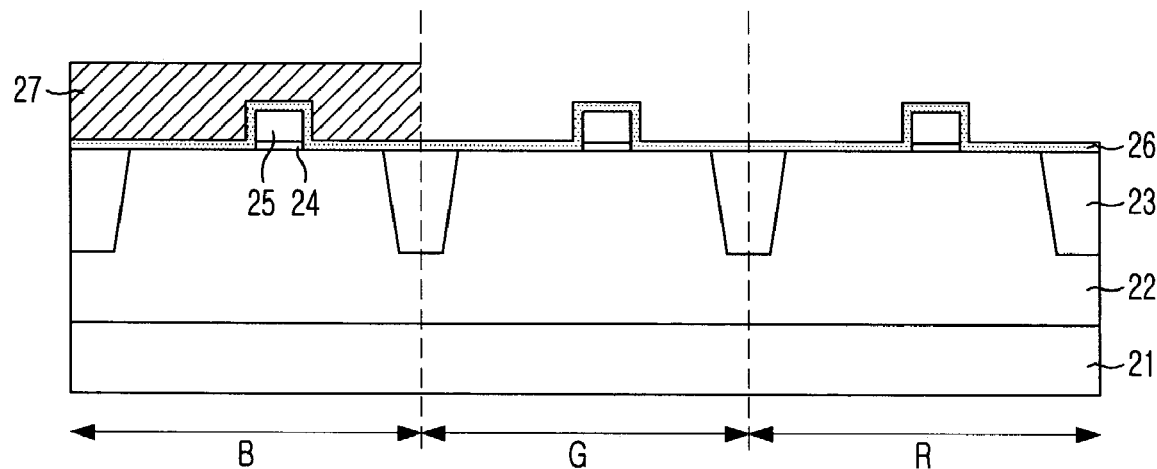
FIGS. 4A to 4H are cross-sectional views illustrating a second method for fabricating the unit pixel of the CMOS image sensor shown in FIG. 2.

With reference to FIG. 4A, a p-type epi layer 22 is grown on a p-type substrate 21 doped with a high concentration of p-type impurities. The p-type epi layer 22 existing beneath the photodiode causes the photodiode to have an increased depletion depth. As a result, it is possible to obtain excellent photosensitizing characteristics.

Next, a field oxide layer 23 is formed on the p-type epi layer 22 so to define a green color region G_region, a red color region R_region and a blue color region B_region.

At this time, the field oxide layer 23 is formed through a STI technique or a LOCOS process.

After forming the field oxide layer 23, a gate oxide layer 24 and a gate electrode are stacked on the p-type epi layer 22. At this time, the gate electrode 25 uses a polysilicon layer or a stacked layer of a polysilicon layer and a tungsten silicide layer. A thickness of the gate electrode 25 ranges from about 2500 Å to about 3500 Å since an ion implantation for forming the deep n⁻ region of the photodiode is proceeded with high energy.

Herein, the gate electrode 25 is a gate electrode of a transfer transistor, and other gate electrodes of other types of transistors constituting the unit pixel are also formed simultaneously.

Afterwards, a first oxide layer 26 is formed on the p-type epi layer 22 including the gate electrode 25, and a first mask 27 covering the blue color region is formed thereon.

At this time, a reticle of the first mask 27 is identical to that of a blue filter mask for forming a blue filter during a color filer array (CFA) formation. This reticle is a photosensitive pattern attained through which a photosensitive film is coated and patterned by using a photo-exposure process and a developing process. Also, a positive photoresist is used to form the photosensitive pattern.

Figure 4B:
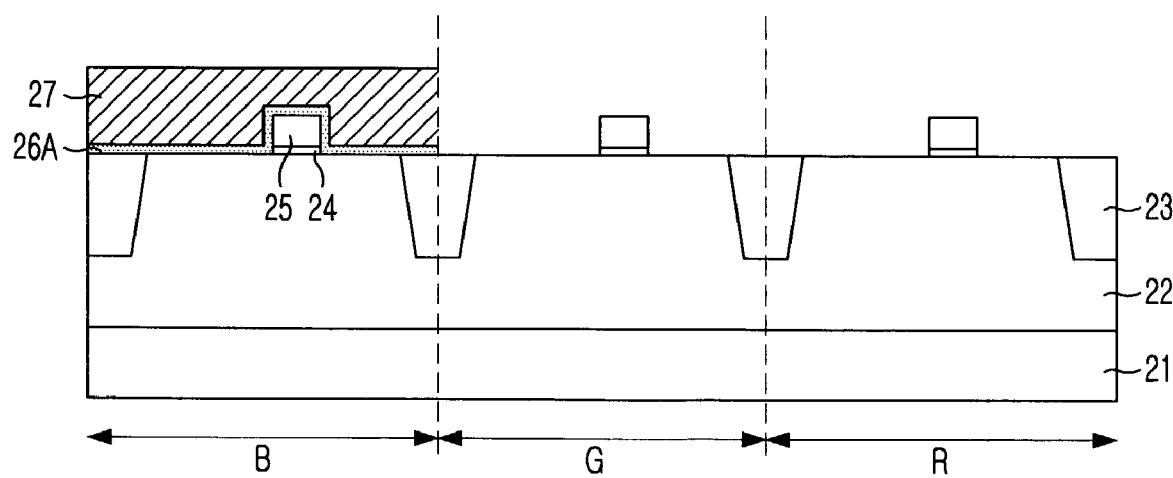

With reference to FIG. 4B, the first oxide layer 26 is proceeded with a wet etching by using the first mask 27 as an etch mask so to form a first blocking layer 26A. At this time, the first blocking layer 26A covers the blue color region and is not formed in the green and red color regions.

Figure 4C:
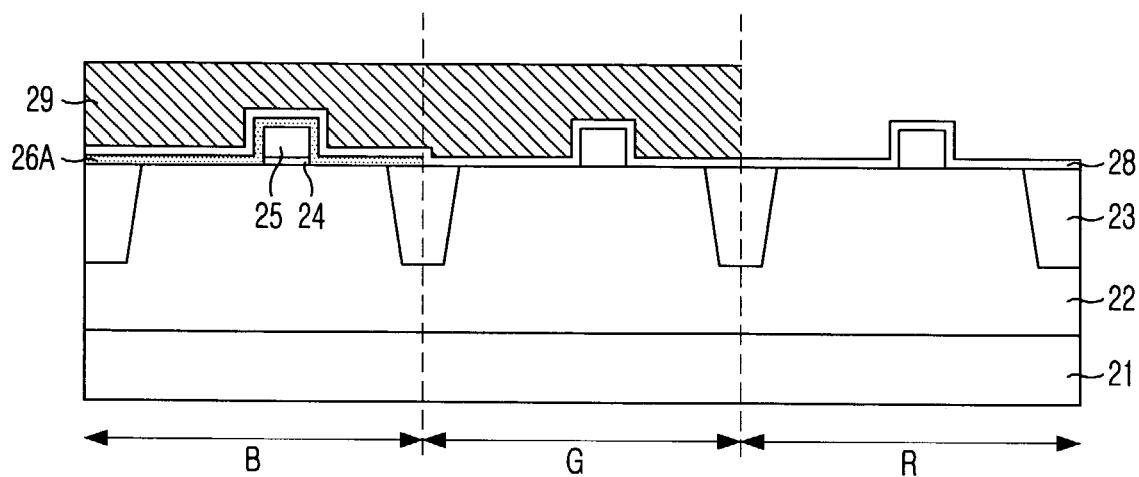

With reference to FIG. 4C, after removing the first mask 27, a second oxide layer 28 is formed on the p-type epi layer 22 including the first blocking layer 26A. A second mask 29 covering the green color region and the blue color region is formed on the second oxide layer 28.

At this time, a reticle of the second mask 28 is identical to that of a green filter mask for forming a green filter during the CFA formation, and is a photosensitive pattern attained through which a photosensitive film is coated and patterned by using a photo-exposure process and a developing process.

Figure 4D:
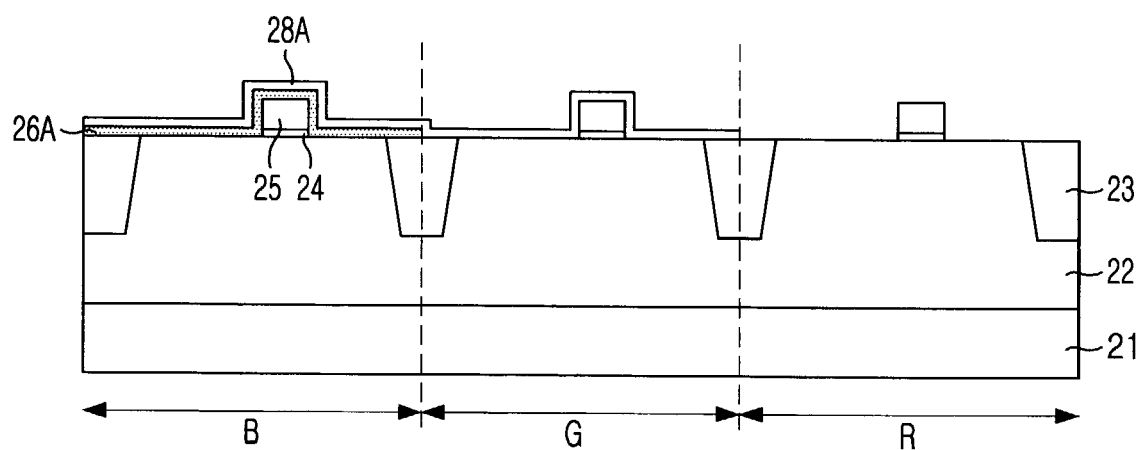

With reference to FIG. 4D, the second oxide layer 28 is proceeded with a wet etching by using the second mask 29 as an etch mask so to form a second blocking layer 28A. At this time, the second blocking layer 28A covers the blue color region and the green color region but is not formed in the red color region.

Next, the second mask 29 is removed.

Figure 4E:
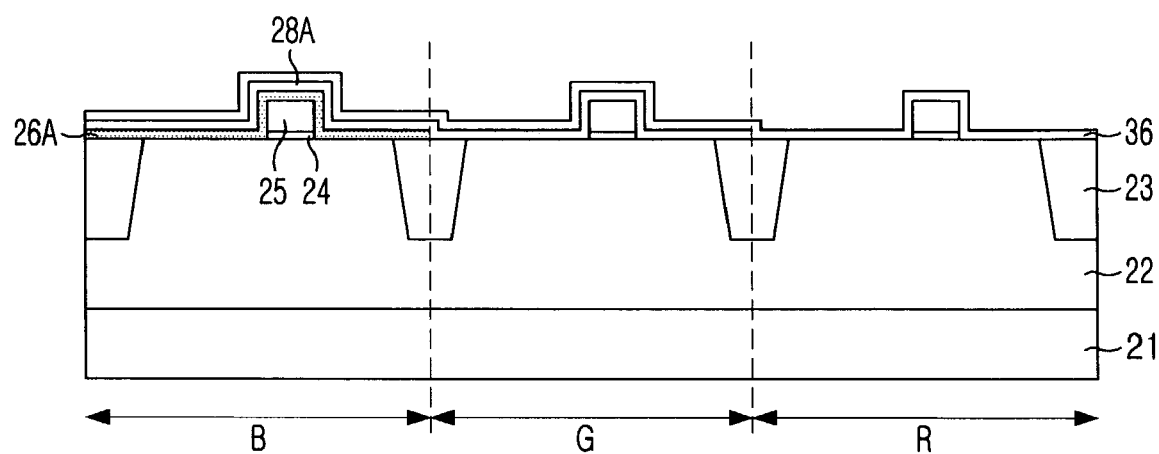

Referring to FIG. 4E, an oxide material is deposited on an entire surface of the structure including the second blocking layer 28A so to form a third blocking layer 36 covering the whole region.

By adopting the first, the second and the third blocking layers 26A, 28A and 36, a triple layer of the first blocking layer 26A, the second blocking layer 28A and the third blocking layer 36 is remained in the blue color region, a double layer of the second blocking layer 28A and the third blocking layer 36 in the green color region and a single layer of the third blocking layer 36 in the red color region.

In other words, the blue color region for receiving blue light has the most thick blocking layer while the red color region for receiving red light has the least thick blocking layer. Also, the green color region for receiving green light has an intermediately thick blocking layer. Eventually, as the wavelength of the light is longer, the thickness of the blocking layer is thinner.

Figure 4F:
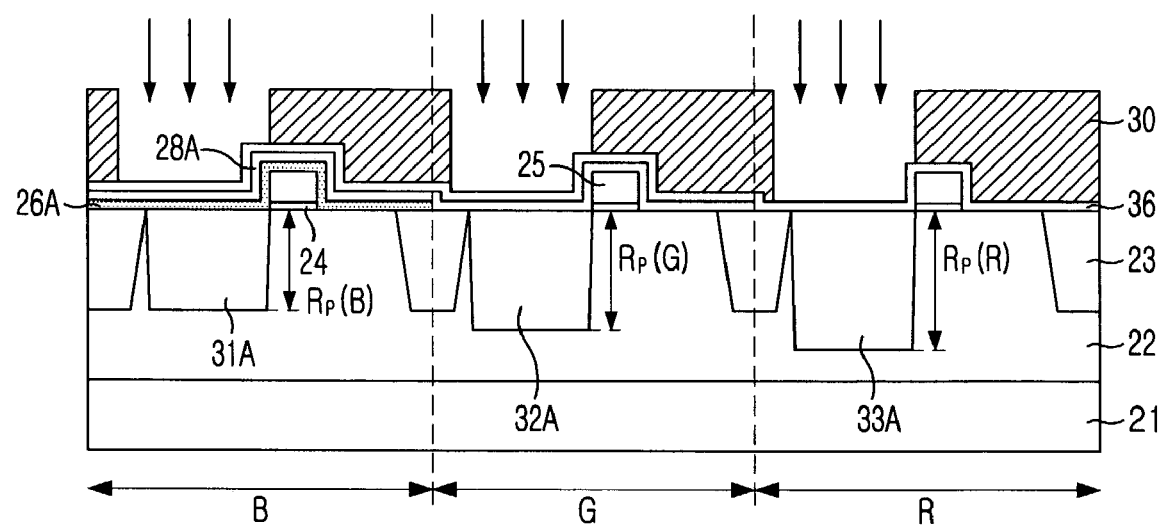

Referring to FIG. 4F, a photosensitive film is coated on the entire structure including the third blocking layer 36 and patterned through a photo-exposure process and a developing process so as to form a third mask 30 defining the deep $n^-$ region of the photodiode.

At this time, the third mask 30 is aligned in one edge of the gate electrode 25 and one edge of the field oxide layer 23. Also, the third mask 30 covers the other side of the gate electrode 25, e.g., a portion for forming a floating diffusion region.

Next, an ion implantation of an n-type dopant is carried out with high energy but without any tilted incident angle and rotation. Herein, the third mask 30 is used as an ion implantation mask.

At this time, after the ion implantation, a first n-type region 31A having the most shallow Rp is formed within the p-type epi layer 22 of the blue color region. In the red color region, a third n-type region 33A having the deepest Rp is formed, while a second n-type region 32A having an intermediate depth of the Rp is formed in the green color region.

Even if the ion implantation is carried out under the same ion implantation recipe, the Rp for each color region is different from each other due to a different thickness of the blocking layer formed in each color region. That is, the blocking layer acts as a mask when ion implanting, resulting in a different Rp for each color region.

Through the above ion implantation, the first, the second and the third n-type regions 31A, 32A and 33A have the RP of Rp(B), Rp(G) and Rp(R), respectively. Also, a degree of the depth of the first, the second and the third n-type regions 31A, 32A and 33A is in an order of Rp(R)>Rp(G)>Rp(B).

Figure 4G:
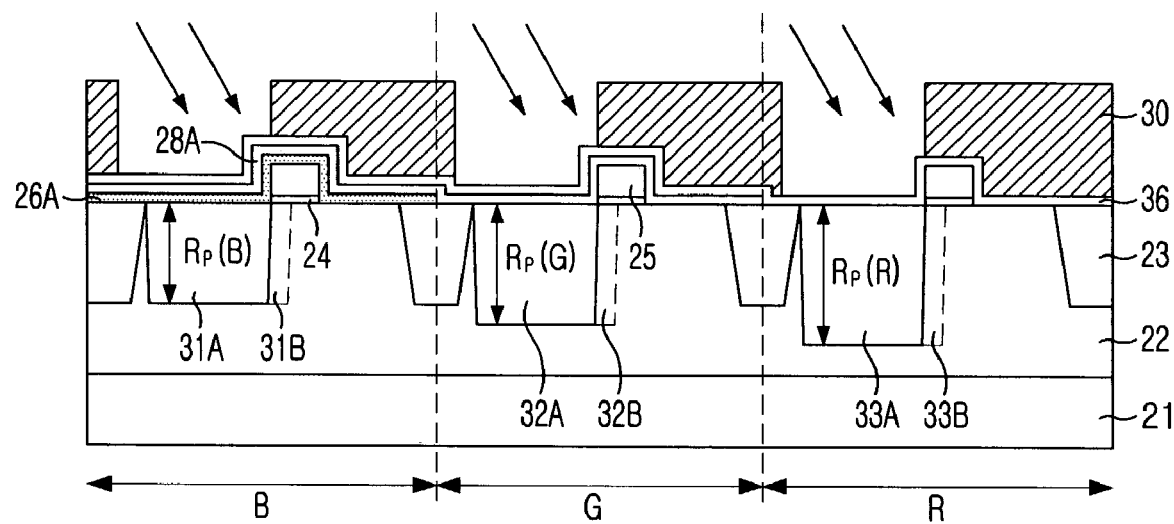

Referring to FIG. 4G, another ion implantation is proceeded with a medium energy by giving a tilted incident angle and rotation. At this time, the third mask 30 is still remained.

Since the ion implantation is proceeded with the tilted incident angle, each of the first, the second and the third n-type regions 31A, 32A and 33A has a doping profile expanded downwardly from the gate electrode 25. In other words, a first n-type expansion region 31B, a second n-type expansion region 32B and a third n-type expansion region 33B are formed.

Figure 4H:
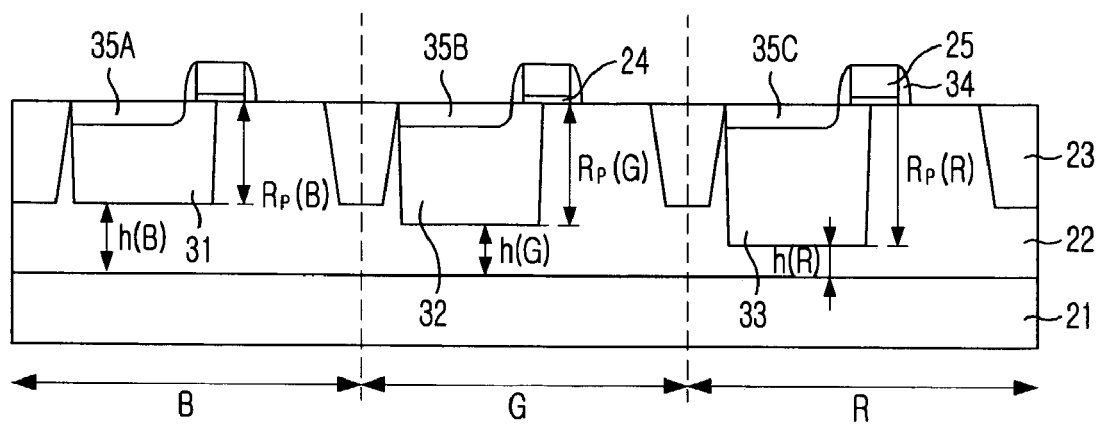

Referring to FIG. 4h, the third mask 30 is removed thereafter.

A first $n^-$ region, a second $n^-$ region and a third $n^-$ region 31, 32 and 33 constructing the $n^-$ region of the photodiode through two applications of the ion implantation. That is, the first $n^-$ region 31 having Rp(B) is formed in the blue color region, the second $n^-$ region 32 having Rp(G) in the green color region and the third $n^-$ region 33 having Rp(R) in the red color region. In addition, the Rp(R) of the third $n^-$ region 33 is deeper than the Rp(B) of the first $n^-$ region 31 and the Rp(G) of the second $n^-$ region 32, meaning that the Rp is deeper as the wavelength of light incident to the photodiode is longer.

An insulating layer is deposited on an entire surface exposed after removing the third mask 30, and an etch-back process is applied thereto so as to form a spacer 34 contacting to both lateral sides of the gate electrode 25. At this time, the insulating layer for forming the spacer 34 uses a nitride layer or an oxide layer. Since the first and the second blocking layers 26A and 28A are oxide layers, they are removed during the etch-back process for forming the spacer 34.

Next, a p-type dopant is ion implanted by using the gate electrode 25 and the spacer 34 as an ion implantation mask so to form shallow $p^0$ regions 35A, 35B and 35C, each being formed in each color region. At this time, the $p^0$ regions 35A, 35B and 35C are formed through the ion implantation along with a state that the first and the second blocking layers 26A and 28A are removed. Hence, each $p^0$ region in each color region has the identical depth.

In other words, the photodiode including the first $n^-$ region 31 and the $p^0$ region 35A is formed in the blue color region, the photodiode including the second $n^-$ region 32 and the $p^-$ region 35B in the green color region, and the photodiode including the third $n^-$ region 33 and the $p^0$ region 35C in the red color region.

Herein, a distance h(R) between the third $n^-$ region 33 and the p-type substrate 21 is the shortest while a distance h(B) between the first $n^-$ region 31 and the p-type substrate 21 is the longest. Also, a distance h(G) between the second $n^-$ region 32 and the p-type substrate 21 is an intermediate distance.

Meanwhile, as the distance h between the p-type substrate 21 and the n type region, particularly, the h(R) decreases, it is possible to prevent the cross-talk phenomenon occurring between neighboring pixels due to red light. The reason for this result is because a concentration of drift electrons is decreased due to active recombination of an electron hole pair (EHP) during inputs of optical charges owing a fact that the distance from the p-type substrate 21 decreases.

With respect to the thickness of the above blocking layers 26A, 28A and 36, the thickness of the blocking layer in the blue color region ranges from about 1500 Å to about 2000 Å The blocking layer in the green color region has the thickness of about 1000 Å while the blocking layer in the red color region has the thickness of about 500 Å.

Accordingly, since each color region has different thickness of the blocking layer, it is possible to have various Rp even with the identically applied ion implantation process. As a result, a color ratio can be improved. For instance, a typical color ratio, that is, red/green and blue/green have a ratio of about 0.5 to about 0.6. However, the present invention can provide the color ratio close to 1.

Although it is not illustrated in FIGS. 4A to 4H, an insulating layer is formed on the p-type epi layer 22 including the photodiode, and color filters are formed thereon. Each of the color filters corresponds to each color region.

In accordance with the present invention, a depth of the photodiode that receives red light is increased to distribute optical charges induced by the red light to the photodiode, thereby improving red signal characteristics.

Also, the depth of the photodiode, differentiated based on each different color region, is formed through the use of reticles of the CFA without an additional reticle formation process. This differently formed depth of the photodiode provides an effect of improving reproducibility of color.

Additionally, a distance between the photodiode and the p-type substrate is decreased to prevent the cross-talk phenomenon occurring between neighboring pixels.

Furthermore, since each blocking layer has a different thickness, it is possible to achieve various Rp even when the identical ion implantation process is applied. This fact further provides an advantage of an improvement on color ratio.

While the present invention has been described with respect to certain preferred embodiments, it will be apparent to those skilled in the art that various changes and modifications may be made without departing from the scope of

What is claimed is:

1. A method for fabricating an image sensor, the method comprising:
    forming a plurality of gate electrodes on a substrate including an epi-layer defining a blue color region, a green color region and a red color region;
    forming a first ion implantation blocking layer covering the blue color region;
    forming a second ion implantation blocking layer covering the blue color region and the green color region;
    forming a third ion implantation blocking layer covering the blue color region, the green color region and the red color region;
    forming a mask on the third ion implantation blocking layer, the mask exposing upper portions of the epi layer in which a plurality of photodiodes are to be formed;
    forming the photodiodes, each having different depths for each color region by applying an ion implantation process to the epi layer; and
    forming color filters corresponding to each color region.

2. The method as recited in claim 1, further comprising the steps of:
    forming an n-type ion implantation region through two the ion implantation processes at the step of applying the ion implantation process;
    removing the mask;
    forming an insulating layer for a spacer on an entire surface including the gate electrode;
    forming a spacer contacting to lateral sides of the gate electrode by applying an etch-back process to the insulating layer and the ion implantation blocking layers; and
    forming a p-type ion implantation region on the n-type ion implantation region by using the spacer and the gate electrode as a mask.

3. The method as recited in claim 2, wherein the step of forming the n-type ion implantation region includes the steps of:
    performing a first ion implantation; and
    performing a second ion implantation with energy lower than the energy applied for the first ion implantation.

4. The method as recited in claim 1, wherein the step of forming the first ion implantation blocking layer includes further the steps of:
    forming a first oxide layer on the epi layer including the gate electrode;
    forming a mask covering the blue color region on the first oxide layer; and
    forming the first ion implantation blocking layer by etching the first oxide layer with the use of the mask as an etch mask.

5. The method as recited in claim 4, wherein the mask is formed with a reticle for forming a blue color filter.

6. The method as recited in claim 1, wherein the step of forming the second ion implantation blocking layer further includes the steps of:
    forming a second oxide layer on the first ion implantation blocking layer;
    forming a mask covering the blue color region and the green color region on the second oxide layer; and
    forming the second ion implantation blocking layer by etching the second oxide layer with the use of the mask as an etch mask.

7. The method as recited in claim 6, wherein the mask is formed with a reticle for forming a green color filter.

8. The method as recited in claim 1, wherein the first, the second and the third ion implantation blocking layers are oxide layers.

9. A method for forming a photodiode of an image sensor, comprising the steps of:
    forming a field oxide layer in a substrate to define a plurality of color region classified with a blue color region, a green color region and a red color region;
    forming a first ion implantation blocking layer covering the blue color region on the subrate;
    forming a second ion implantation blocking layer covering the blue color region and the green color region;
    forming a third ion implantation blocking layer covering the blue color region, the green color region and the red color region;
    forming an n-type ion implantation region in the substrate of each color region through an ion implantation, wherein the n-type ion implantation region in each color region has different depth according to wavelength of light corresponding to each color region;
    performing ion implantation of an n-type dopant into the substrate by using the mask as an ion implantation mask;
    removing the ion implantation blocking layers; and
    forming a p-type ion implantation layer on the n-type ion implantation region.

10. The method as recited in claim 9, wherein the n-type ion implantation region has a depth being deeper as the wavelength of light corresponding to each color region is longer.

11. The method as recited in claim 9, wherein the step of forming the n-type ion implantation region includes the steps of:
    performing a first ion implantation; and
    performing a second ion implantation with energy lower than the energy applied for the first ion implantation.

12. The method as recited in claim 9,
wherein the step of forming the n-type ion implantation region includes the steps of:
forming a mask on the third ion implantation blocking layer, the mask exposing upper portions of the substrate in which the photodiodes are formed; and
performing ion implantation of an n-type dopant into the substrate by using the mask as an ion implantation mask.

13. The method as recited in claim 12, wherein the first, the second and the third ion implantation blocking layer are oxide layers.

14. The method as recited in claim 9, wherein the step of removing the ion implantation blocking layers is performed by an etch-back process.

* * * * *